(12) United States Patent
Chuang

(10) Patent No.: US 8,259,441 B2
(45) Date of Patent: Sep. 4, 2012

(54) EXTRACTING AND INSTALLING STRUCTURE FOR ELECTRICAL DEVICE

(75) Inventor: Hsien-Cheng Chuang, Taipei (TW)

(73) Assignee: Inventec Corporation, Taipei (TW)

( * ) Notice: Subject to any disclaimer, the term of this patent is extended or adjusted under 35 U.S.C. 154(b) by 542 days.

(21) Appl. No.: 12/555,147

(22) Filed: Sep. 8, 2009

(65) Prior Publication Data

US 2011/0013352 A1    Jan. 20, 2011

(30) Foreign Application Priority Data

Jul. 17, 2009   (TW) .............................. 98124194 A

(51) Int. Cl.
*H05K 5/00* (2006.01)
*H05K 7/00* (2006.01)
(52) U.S. Cl. ......... 361/679.31; 361/679.33; 361/679.37; 361/679.38; 361/679.39
(58) Field of Classification Search ............. 361/679.31, 361/679.33, 679.37, 679.38, 679.39
See application file for complete search history.

(56) References Cited

U.S. PATENT DOCUMENTS

| 7,375,960 | B2* | 5/2008 | Blaalid et al. | 361/679.33 |
| 7,495,908 | B2* | 2/2009 | Zhang et al. | 361/679.33 |
| 2005/0157464 | A1* | 7/2005 | McAlister | 361/685 |
| 2006/0067042 | A1* | 3/2006 | Salinas et al. | 361/685 |

FOREIGN PATENT DOCUMENTS

| TW | M303460 | 12/2006 |
| TW | M310359 | 4/2007 |
| TW | M329836 | 10/2007 |

* cited by examiner

*Primary Examiner* — Anthony Haughton
(74) *Attorney, Agent, or Firm* — WPAT, PC; Justin King

(57) ABSTRACT

An extracting and installing structure for electrical device is disclosed, which comprises: a base for receiving an electrical device; a first chute; a linkage rod, configured with a first protrusion and capable of sliding inside the first chute in a first direction; and a rotatable tenon, configured with a second chute and an interlocking end as the second chute is provided for the first protrusion of the linkage rod to inset therein and the interlocking end is fitted inside an interlocking element of the base; wherein, when the linkage rod is driven to rotate the rotatable tenon, the rotatable tenon is going to force the electrical device to move in a second direction perpendicular to the first direction.

16 Claims, 6 Drawing Sheets

EXTRACTING AND INSTALLING STRUCTURE FOR ELECTRICAL DEVICE

FIELD OF THE INVENTION

The present invention relates to an extracting and installing structure for electrical devices, and more particularly, to an extracting and installing structure capable of enabling an electrical device to move alternatively in two different directions that are perpendicular to each other.

BACKGROUND OF THE INVENTION

Generally, there is a space in every computer specifically designed for accommodating hard disk drives. Accordingly, there are already many studies out there that attempt to design a mechanism for facilitating the convenience of retracting/installing hard disk drives from/into such space.

One of which relates to a mounting apparatus for retractable hard disk disclosed in TW. Pub. No. M303460. In the multi-link drive mechanism of this mounting apparatus, the first linkage road is coupled to a lever while arranging an end of its second linkage rod to be connected to a base and another end thereof to be connected to a slidable panel as the tip of the slidable panel is extended and thus formed as a driving component that is disposed between a connector seat and a hard disk drive, by that the driving component can be enabled to push the hard disk drive to displace for a comparatively large distance and thus detach the same from the connector seat in a rapid and simple manner. Another such study relates to a hard drive extracting mechanism disclosed in TW Pat. Pub. No. M310359, in which the driving unit, being arranged passing through a hollowed section formed in a panel seat of a panel unit, is configured with a connector provided for connecting the same to the panel unit and a push element that is fitted inside a chute from the back as it is extruding from the front of the chute while being arranged at a position near the rear of a hard drive. As the panel is capable of being driven to rotate between an open position and a close position in relative to the panel seat, the rotation of the panel can bring along the driving unit to force the hard drive to slide inside the frame of the hard drive extracting mechanism between a installation position and an ejection position, by that any computer having the aforesaid hard drive extracting mechanism is able to remove the hard drive without having to dismantle housing of the computer. Furthermore, there is a hard drive ejection structure disclosed in M329836, in which there are two ears with chute holes extending from an end of a first linkage rod while enabling one end of the first linkage rod that is arranged at a side of a drive frame to be coupled with a lever and another thereof to be coupled with a connecting element of a second linkage rod. Moreover, the second linkage rod that is arranged near the rear of the drive frame is configured with a pushing element, formed on an end thereof opposite to the end where the connecting element is arranged, is coupled to a side of the drive frame by another end thereof while enabling the connecting element to be disposed at a position corresponding to the chute holes of the ears formed on the first linkage rod. Thereby, a structure for ejecting a hard drive in a smooth manner is achieved.

In view of the aforesaid patents, despite of their different structures, the hard drive can only be driven to move in a single direction defined by their linkage mechanism no matter it is for installing or extracting. That is, the hard drive can only be installed or extracted in a direction facing directly toward its connector. However, it is common in real world that the hard drive will not be able to align directly with its connecter for installation or extraction as it is restricted by the space available in computer shell. Therefore, the structures shown in the aforesaid patents are not suitable for installing or extracting a hard drive into/out of a shell in a direction that is not directly aligned with its connector.

SUMMARY OF THE INVENTION

In view of the disadvantages of prior art, the object of the present invention is to provide an extracting and installing structure capable of enabling an electrical device to move alternatively in two different directions that are perpendicular to each other so as to greatly reduced the space required for the electrical device to displace during the extracting or installing, that is, the extracting and installing structure is able to minimize the displacement of the electrical device required for extracting the same from its connecter for allowing enough space to be left in an accommodation space of the hard drive to be used for removing the hard drive out of the accommodation space.

To achieve the above object, the present invention provides an extracting and installing structure for electrical device, comprising: an electrical device; a vertical driving component, for transmitting an reaction force working in a vertical direction; and a rotatable tenon, for transforming the vertical reaction force from the vertical driving component to another reaction force working in a horizontal direction while applying the horizontal reaction force upon the electrical device for forcing the electrical device to displace horizontally.

Moreover, to achieve the above object, the present invention provides an extracting and installing structure for electrical device, which comprises: a base for receiving an electrical device; a first chute; a linkage rod, configured with a first protrusion and capable of sliding inside the first chute in a first direction; and a rotatable tenon, configured with a second chute and an interlocking end as the second chute is provided for the first protrusion of the linkage rod to inset therein and the interlocking end is fitted inside an interlocking element of the base; wherein, when the rotatable tenon is brought along to rotate by the movement of the linkage rod, the rotating rotatable tenon will drive the electrical device to move in a second direction perpendicular to the first direction.

Further scope of applicability of the present application will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below and the accompanying drawings which are given by way of illustration only, and thus are not limitative of the present invention and wherein.

DESCRIPTION OF THE EXEMPLARY EMBODIMENTS

For your esteemed members of reviewing committee to further understand and recognize the fulfilled functions and structural characteristics of the invention, several exemplary embodiments cooperating with detailed description are presented as the follows.

Figure 1:
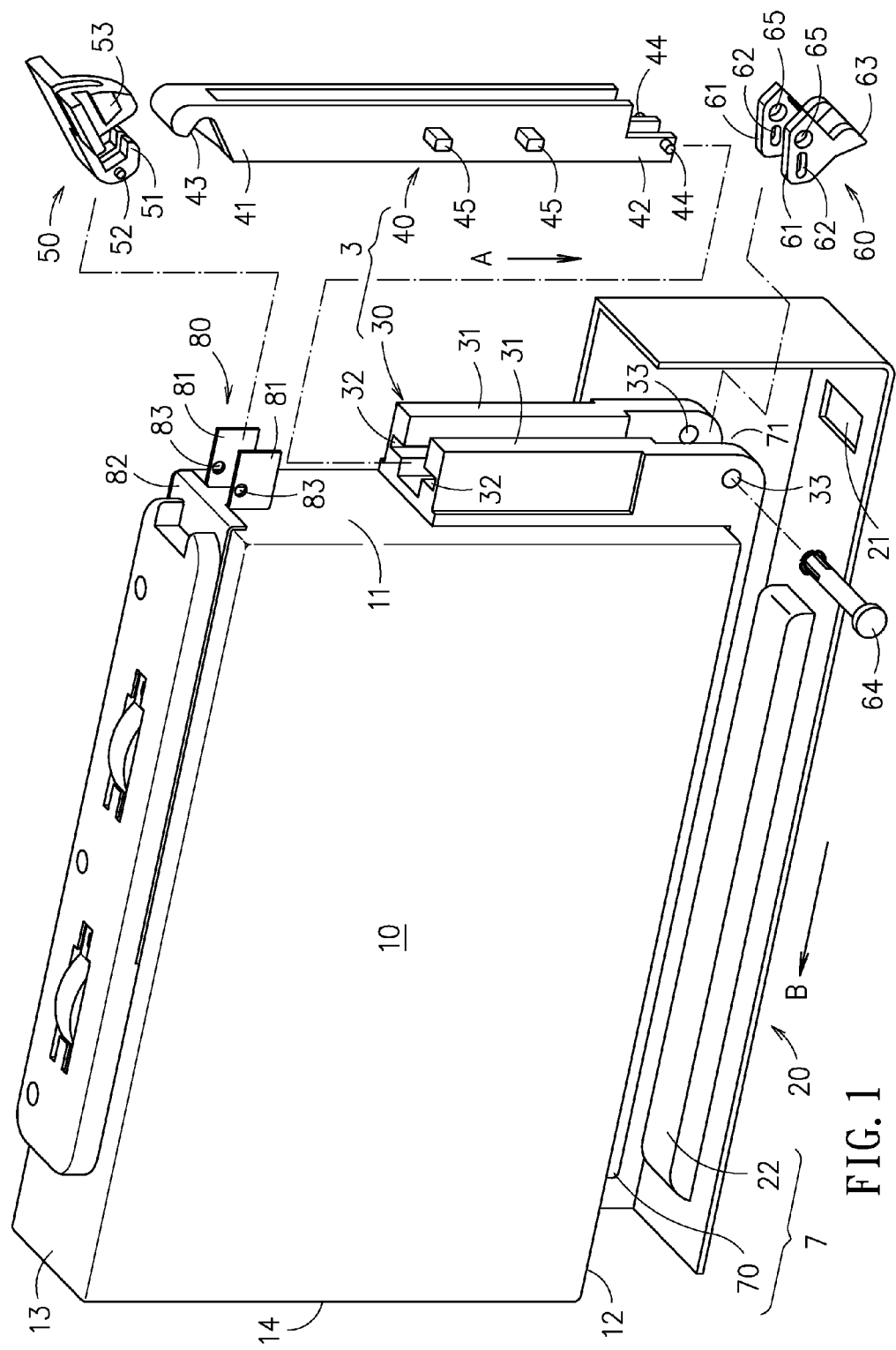
FIG. 1 is an exploded view of an extracting and installing structure for electrical device according to the present invention.
Figure 2:
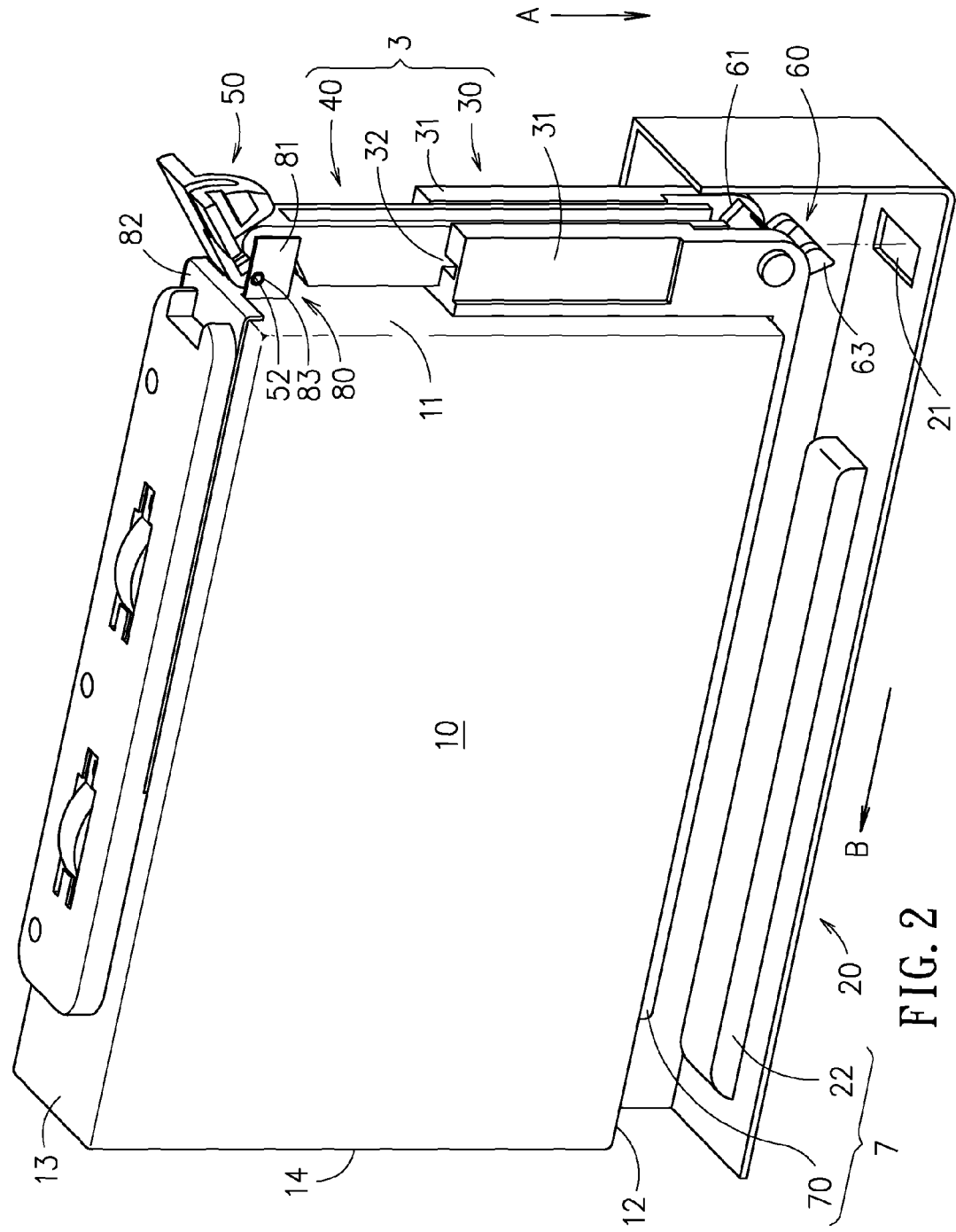
FIG. 2 is a three dimensional view of an extracting and installing structure for electrical device according to the present invention.

Please refer to FIG. 1 and FIG. 2, which show an extracting and installing structure for electrical device according to an embodiment of the present invention. In this embodiment, the electrical device can be a hard drive, a floppy drive, an optical drive or any interface with connecters. However, the present embodiment uses a hard drive as the electrical device only for illustration. As shown in FIG. 1 and FIG. 2, the extracting and installing structure for electrical device comprises: a hard drive 10, a base 20, vertical driving component 3 configured with a first chute 30 and a linkage rod 40, and a rotatable tenon 60.

Figure 3:
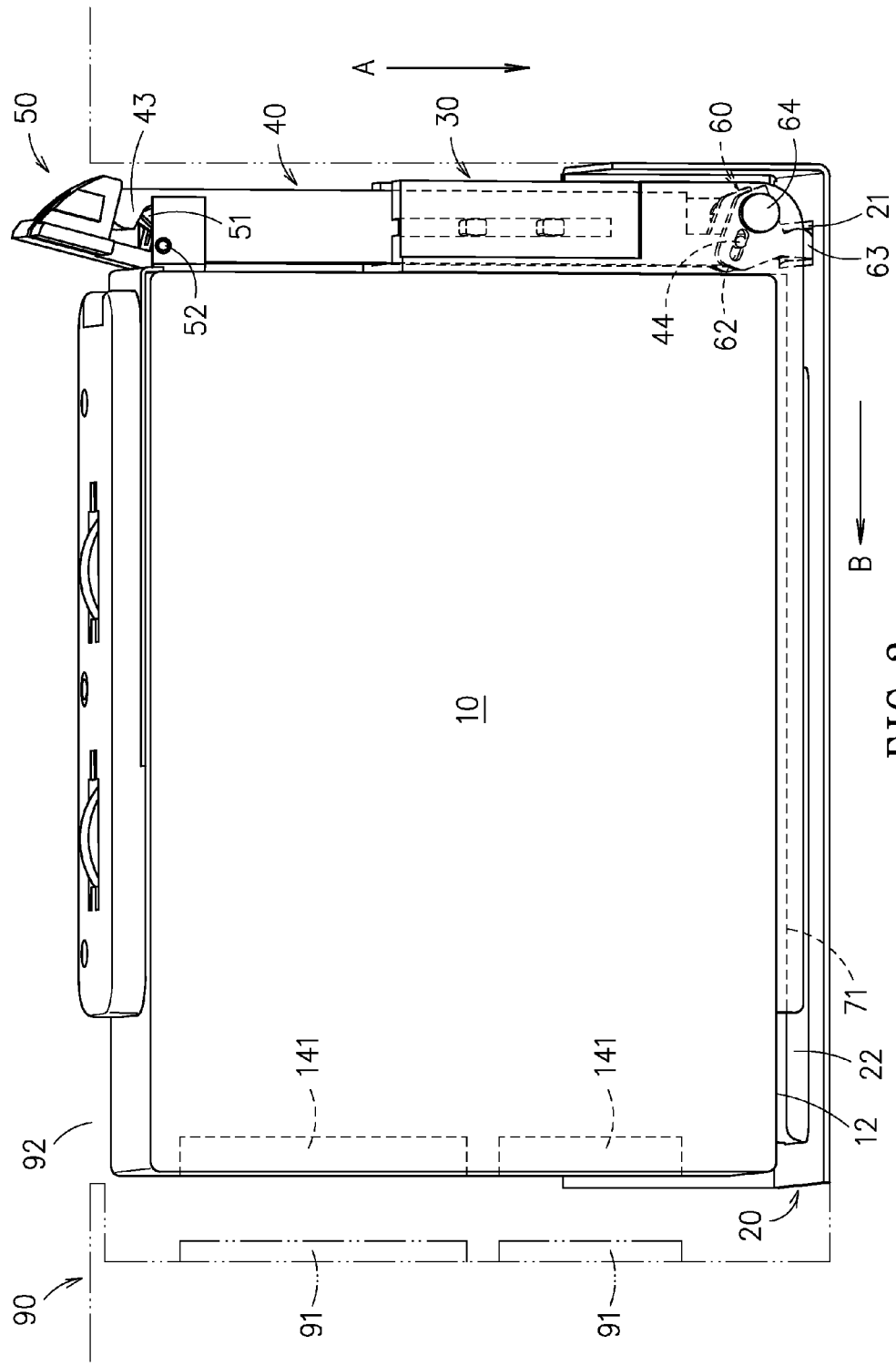
FIG. 3 to FIG. 5 are schematic diagrams showing a series of movements relating to how a hard drive is connected to its connector by the use of an extracting and installing structure for electrical device according to the present invention.

The hard drive 10 is substantially a rectangle block that is configured with a first side 11, a second side 12, a third side 13 and a fourth side 14 in a manner that the second side 12 and the third side 13 are arranged neighboring to and also perpendicular to the first side 11, while the fourth side 14 is arranged neighboring to the second side 12 and the third side 13 but is parallel with the first side 11. Moreover, the fourth side 14 is provided for connecting interfaces 141 to dispose therein, as shown in FIG. 3.

The base 20, being designed for receiving the hard drive 10, is configured with an interlocking element 21 whose function will be provided hereinafter. The base can be disposed inside a computer 90 or relating electrical device whichever has connectors 91 provided for connecting with the connecting interfaces 141 of the hard drive 10, as shown in FIG. 3. However, the base is not being restricted to be the one shown in this embodiment, which can be formed as a structure on the inner wall of the shell of the computer 90. In addition, the interlocking element 21 is also not being limited by the rectangle-shaped hole shown in FIG. 1 that it can be also being formed as a structure on the inner wall of the shell of the computer 90.

The first chute 30, being arranged on the first side 11 of the hard drive 10, is composed of two parallel-arranged first plates 31, whereas each first plate 31 has a first groove 32 formed on the inner wall thereof in a manner that the two grooves 32 are arranged facing toward each other and are extending in a direction parallel with the first direction A. Moreover, the first chute 30 is further connected with a horizontal guiding component 7 by the bottom thereof. In this embodiment, the horizontal guiding component 7 includes a level element 70 and a protruding rail 22. The level element 70 is substantially an extension portion of the first chute 30 from the bottom thereof that is arranged on the second side 12 of the hard drive 10, and accordingly, the level element 70 can be integrally formed with the first chute 30. Moreover, the level element 70 is configured with a second groove 71 provided for the protruding rail 22 on the base 20 to inset therein; and the both the groove 71 and the protruding rail 22 are extending in a direction parallel with the second direction B as the second direction B is perpendicular to the first direction A. In this embodiment, the first direction A is a direction perpendicular to the ground and the second direction B is a direction parallel with water level.

The linkage rod 40 is substantially a bar with a first end 41 and a second end 42, while there are two protrusions 44 formed respectively on two opposite sides of the second end 42 at positions corresponding to each other, and there are two knobs 45 formed respectively one two opposite of the linkage rod 40 that are provided for insetting inside the first grooves 32 corresponding to the sides where it is formed, and thereby, the linkage rod 40 is inset inside the first chute 30. Operationally, the linkage rod 40 can be driven to slide in a reciprocating manner in the first chute 30 following a direction parallel with the first direction A.

The rotatable tenon 60, being pivotally disposed on the first side 11 of the hard drive 10, is sandwiched between the first plates 31 of the first chute 30, which is further being pivotally connected to the first chute 30 by the piecing of a shaft 64 into the first pivots 33 of the first plates 31 and the second pivot holes 65 of the rotatable tenon 60. In addition, the rotatable tenon 60 is configured with two parallel-disposed third plates 61, each third plate 61 having a bar-like second chute 62 disposed thereon while arranging the two second chutes 62 at positions corresponding to each other; and the linkage rod 40 is disposed between the two parallel-disposed third plates 61 in a manner that the first protrusions 44 of the linkage rod 40 are fitted inside the second chutes 62. Moreover, the rotatable tenon 60 is further configured with an interlocking end 63 provided to be fitted inside the interlocking element 21 of the base 20.

Operationally, for facilitating the convenience of driving the linkage rod 40 to slide in a reciprocating manner in the first chute 30 following a direction parallel with the first direction A, the linkage rod 40 is designed with a lever 50 at the top thereof, as shown in FIG. 1 and FIG. 2. The Lever 50, being pivotally disposed on the first side 11 of the hard drive 10, is configured with a second hook 51, which is provided to interlock with a first hook 43 formed on the first end 41 of the linkage rod 40. Moreover, there is a pivotally connecting unit 80 disposed on the first side 11 of the hard drive 10, which is composed of two parallel-arranged second plates 81, each having a pivot hole 83 formed thereon while arranging the two pivot holes 83 at positions corresponding to each other, and the two parallel-arranged second plates 81 are connected to a fixing panel 82. In addition, the lever 50 is configured with two second protrusions 52 respectively at two opposite sides thereof for allowing each second protrusion 52 to be fitted into its corresponding pivot hole 83 of the second plate 81. By the interlocking of the second hook 51 and the first hook 43, the lever 50 can exert a rotating force upon the top of the linkage rod 40 as soon as being pushed, and thus drive to the linkage rod 40 to slide in a reciprocating manner in the first chute 30 following a direction parallel with the first direction A. However, the lever 50 shown in this embodiment is only for illustration, that is, the linkage rod 40 can also be driven to slide in a reciprocating manner without the lever 50. For instance, by exerting a force directly to the top of the linkage rod 40, or through other components similar to the lever 50, it is capable of driving the linkage rod 40 to slide in a reciprocating manner in the first chute 30.

Figure 4:
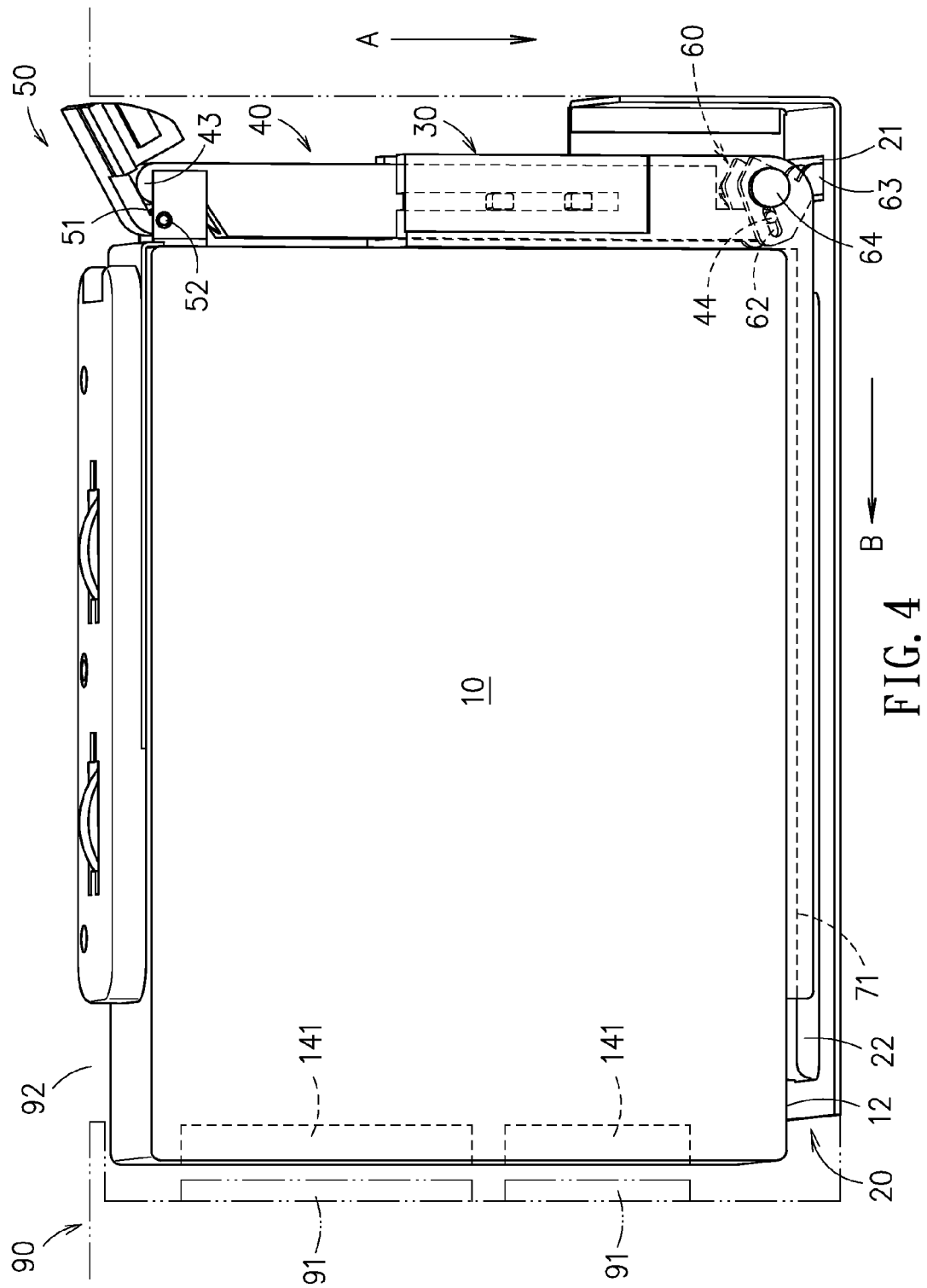
Figure 5:
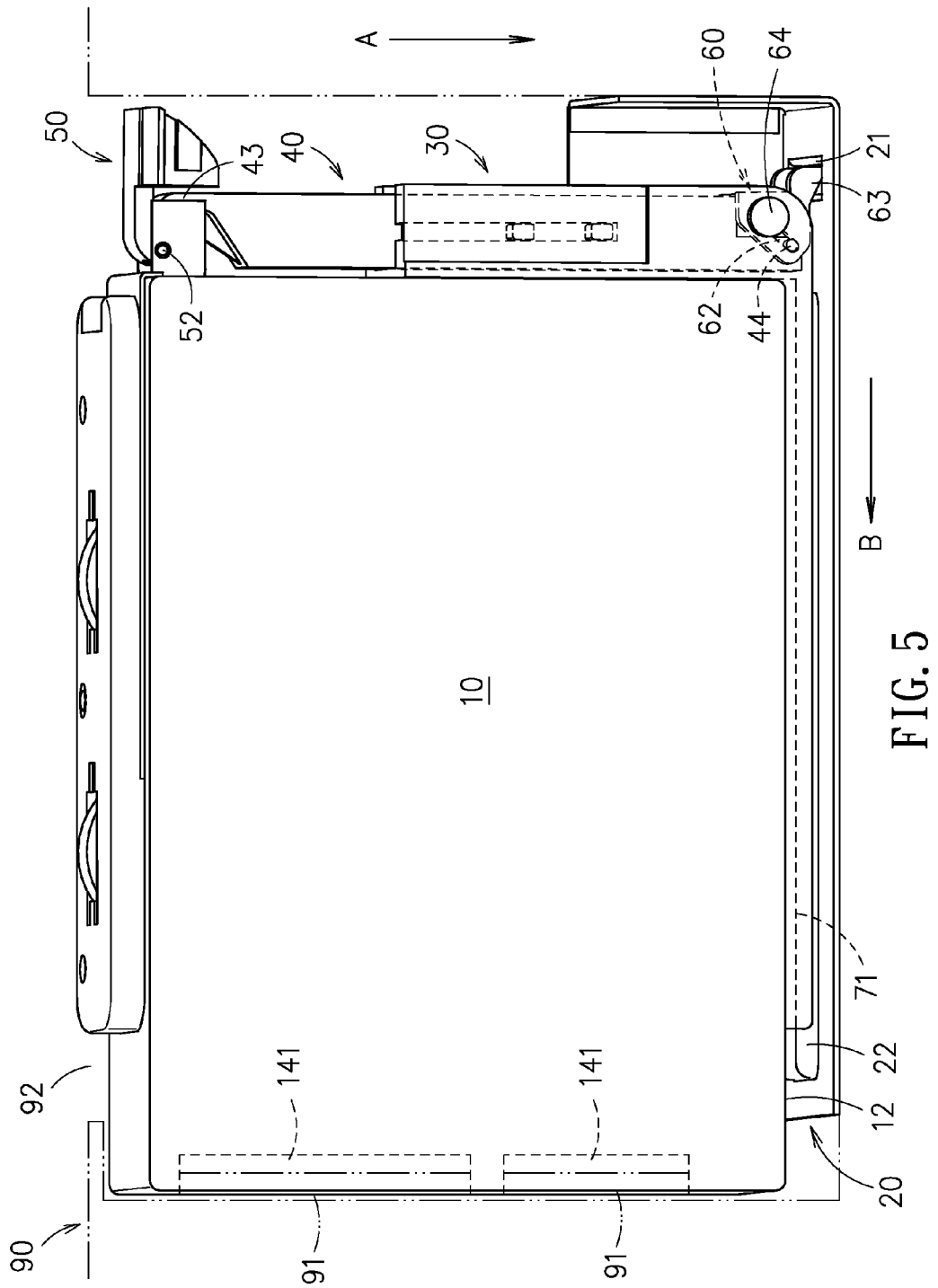

Please refer to FIG. 3 to FIG. 5, which are schematic diagrams showing a series of movements relating to how a hard drive is connected to its connector by the use of an extracting and installing structure for electrical device according to the present invention. In FIG. 3, the base 20 is disposed inside a computer 90 and is configured with connecting interfaces 91 for connecting with the hard drive 10. The computer 90 is formed with an opening 92, provided for the linkage rod 40, the hard drive 10 configured with the linkage rod 40, the lever 50 and the rotatable tenon 60 to be placed inside the computer 90 therefrom. As soon as the hard drive 90 is placed inside the computer 90, the second groove 70 arranged on the bottom of the hard drive 90, i.e. the second side 12, will be engaged with the protruding rail 22 of the base 20 for achieving the initial positioning of the hard drive 10, and at the same time that the interlocking end 63 of the rotatable tenon 60 is inset into the interlocking element 21 of the base 20 while leaving the connecting interfaces 141 of the hard drive 10 to remain detached from their corresponding connectors 91 of the computer 90. As shown in FIG. 4 and FIG. 5, when the lever 50 is driven to rotate centering about its second protrusions 52, the inner wall of the downward-rotating lever 50 will engage with the first hook 43 and thus force the linkage rod 40 to slide downward in the first chute 30 in a direction parallel with the first direction A while simultaneously enabling the first protrusion 44 arranged at the bottom of the linkage rod 40 to slide downward in the second chute 62. During the aforesaid downward sliding of the first protrusion 44 in the second chute 62, a pushing force is generated for forcing the rotatable tenon 60 to rotate counterclockwisely. Moreover, since the interlocking end 63 of the rotatable tenon 60 is engaged with the interlocking element 21, the rotatable tenon 60 that is being enabled to rotate centering about the shaft 64 will cause its interlocking end 63 to abut against the wall of the interlocking element 21 which will generate a pushing force exerting in a direction parallel with the second direction B to be used for forcing the connecting interfaces 141 to move toward their corresponding connectors 91. Therefore, as soon as the lever is being driven to rotate, and thereby brought the linkage rod 40 to keep sliding downward, those connecting interfaces 141 will be force to move toward and eventually engaged with their corresponding connectors 91 so that the hard drive 10 is electrically connected with the computer 90.

Figure 8:
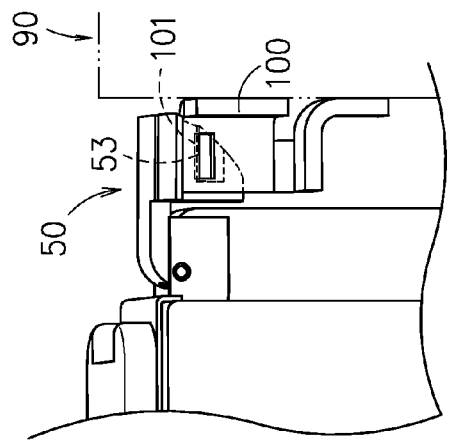
FIG. 6 to FIG. 8 are schematic diagrams showing a series of movements relating to how a lever is interlocked with a corresponding buckle according to the present invention.
Figure 7:
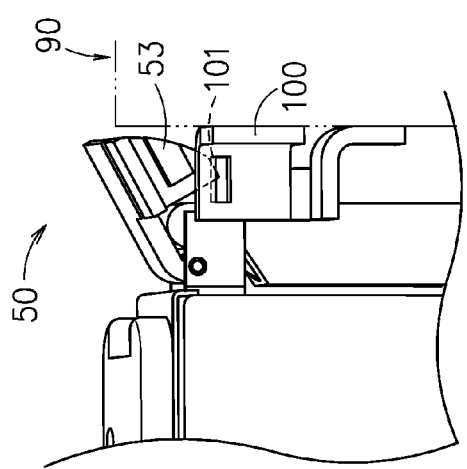
Figure 6:
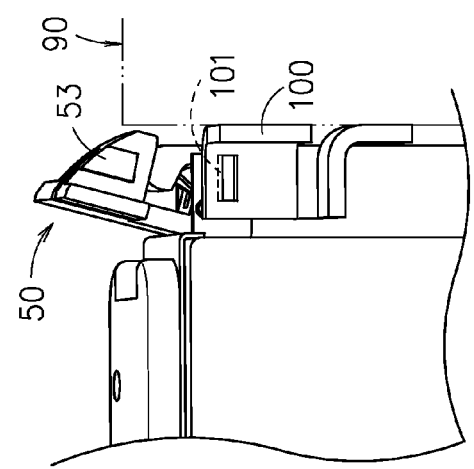

As the embodiment shown in FIG. 5, the opening 92 is arranged at the top of the computer 90, by that the hard drive 10 can be put into the computer 90 following a direction perpendicular to the ground, i.e. the first direction A, and then it is required to move horizontally in the second direction B for engaging the connecting interfaces 141 with their connectors 91. Moreover, for preventing the lever 50 from any unintentional rotation after the connecting interfaces 141 are connected with their connectors 91, the extracting and installing structure of the invention further comprises a fastener for fixing the lever 50 and thus preventing the same from rotating. Please refer to FIG. 6 to FIG. 8, which are schematic diagrams showing a series of movements relating to how a lever is interlocked with a corresponding buckle according to the present invention. As shown in FIG. 6 to FIG. 8, the fastener 100 is configured with a first clasp 101 and the lever 50 is configured with a second clasp 53 at a position thereof corresponding to the first clasp 101; and accordingly the first clasp 101 is capable of interlocking with the second clasp 53 when the lever 50 is rotated toward the fastener 100, and thus causing the lever 50 to be fixed. It is noted that the fastener 100 can be arranged at any position in the extracting and installing structure of the invention, and thus it is not limited by the aforesaid embodiment. In this embodiment, the fastener 100 is arranged at the inner wall of the computer 90. Nevertheless, in another embodiment shown in FIG. 3, it can be disposed on the upward extending portion of the base 20.

The hard drive 10 can be ejected and extracted from the computer 90 simply by rotating the lever 50. That is, when the lever 50 is driven to rotate using its second protrusion 52 as rotation shaft, the second hook 51 will engage with the first hook 43 and thus enable a reaction force causing from the rotating lever 50 to be transmitted from the second hook 51 to the first hook 43. In response to the reaction force, the first hook 43 will drive the linkage rod 40 to move upward and thus cause the first protrusion 44 formed on the linkage rod 40 to move upward as well. Since the first protrusion 44 is received inside the first chute 62, the upward-moving first protrusion 44 will cause a torque to be exerted upon the rotatable tenon 60 which is able to rotate about the rotation shaft 64. As soon as the rotatable tenon 60 is being driven to rotate by the upward-moving first protrusion 44, a pushing force working along the second direction B will be generated for pushing the hard drive 10 away from the base in the second direction B, and thus forcing the connecting interfaces 141 to detached from their corresponding connectors 91. Thereafter, when hard drive 10 is moved to the position shown in FIG. 3 by the pushing force, the whole structure with the hard drive 10, the linkage rod 40, the lever 50 and the rotatable tenon 60 can be retrieved out of the computer 90 from the opening 92. As for the exact moving distance of the hard drive 10 in the second direction B, it can be determined by the sizes of the lever 50, the linkage rod 40 and the rotatable tenon 60 according to actually requirements.

To sum up, in the extracting and installing structure of the invention, the lever 50 is designed for generating and exerting a vertical reaction force upon the top of its linkage rod 40 as soon as it is being driven to rotate; and when the linkage rod 40 is being driven to move by the vertical reaction force, the vertical driving component 3 composed of the first chute 30 and the linkage rod 40 will transmit the vertical reaction force to the rotatable tenon 60 where it is transformed into a horizontal reaction force by the rotation of the rotatable tenon 60. Thereafter, by the second chute 70 of the level element 70 and the protruding rail 22, the hard drive 10 can be positioned and guided to move horizontally. Therefore, since the hard drive 10 can be driven to move alternatively in two different directions that are perpendicular to each other, the space required for the hard drive 10 to displace during the extracting or installing can be greatly reduced, that is, the extracting and installing structure is able to minimize the displacement of the hard drive 10 required for extracting the same from its connecter for allowing enough space to be left in an accommodation space of the hard drive 10 to be used for removing the hard drive out of the accommodation space.

With respect to the above description then, it is to be realized that the optimum dimensional relationships for the parts of the invention, to include variations in size, materials, shape, form, function and manner of operation, assembly and use, are deemed readily apparent and obvious to one skilled in the art, and all equivalent relationships to those illustrated in the drawings and described in the specification are intended to be encompassed by the present invention.

What is claimed is:

1. An extracting and installing structure for an electrical device, comprising:
   a base, for receiving an electrical device, and configured with an interlocking element;
   a first chute, disposed at a first side of the electrical device;
   a linkage rod, configured with at least one first protrusion and capable of sliding inside the first chute in a direction parallel with a first direction; and
   a rotatable tenon, configured with a second chute and an interlocking end as the second chute is provided for the first protrusion of the linkage rod to inset therein and the interlocking end is fitted inside the interlocking element of the base;

wherein, when the rotatable tenon is brought along to rotate by the movement of the linkage rod, the rotating rotatable tenon will drive the electrical device to move in a second direction perpendicular to the first direction.

2. The extracting and installing structure of claim 1, further comprising:
a lever, pivotally connected to the first side of the electrical device, and configured with a second hook provided for interlocking with a first hook formed on the linkage rod in a manner that when the lever is being driven to rotate, the rotating lever is enabled to bring along the linkage rod to move in synchronization and thus drive the rotatable tenon to rotate accordingly.

3. The extracting and installing structure of claim 2, wherein the linkage rod is substantially a bar with a first end and a second end, while the first hook is arranged at the first end and the at least one first protrusion is arranged at the second end.

4. The extracting and installing structure of claim 1, wherein the first chute is composed of two parallel-arranged first plates, each having a first groove formed on the inner wall thereof in a manner that the two grooves are arranged facing toward each other and are extending in a direction parallel with the first direction; and on each of the two sides of the linkage rod, there is at least one knob formed thereon to be provided for insetting inside the first grooves corresponding to the sides where it is formed.

5. The extracting and installing structure of claim 1, further comprising:
a level element, disposed at a second side of the electrical device as the second side is the side of the electrical device neighboring to and perpendicular to the first side;
wherein, there are parallel-arranged grooves and protruding rails formed between the level element and the base that are capable of interlocking with each other, and both the grooves and the protruding rails are extending in a direction parallel with the second direction.

6. The extracting and installing structure of claim 5, wherein the grooves are formed on the level element and the protruding rails are formed on the base.

7. The extracting and installing structure of claim 5, wherein the level element is connected to the first chute.

8. The extracting and installing structure of claim 2, further comprising:
a pivotally connecting unit, disposed on the first side of the electrical device while protruding out therefrom to be used for pivotally connecting with the lever.

9. The extracting and installing structure of claim 8, wherein the pivotally connecting unit is composed of two parallel-arranged second plates, each having a pivot hole formed thereon while arranging the two pivot holes at positions corresponding to each other; and the lever is configured with two second protrusions arranged respectively at two opposite sides thereof for allowing each second protrusion to be fitted into its corresponding pivot hole.

10. The extracting and installing structure of claim 9, wherein the two parallel-arranged second plates are connected to a fixing panel as the fixing panel is disposed on a third side of the electrical device while the third side is the side of the electrical device neighboring to and perpendicular to the first side.

11. The extracting and installing structure of claim 1, wherein the first protrusions of the linkage rod are arranged at positions on two opposite sides of the linkage rod that are corresponding to each other; the rotatable tenon is configured with two parallel-disposed third plates, each third plate having a second chute disposed thereon while arranging the two second chutes at positions corresponding to each other; and the linkage rod is disposed between the two parallel-disposed third plates in a manner that the first protrusions of the linkage rod are fitted inside the second chutes.

12. The extracting and installing structure of claim 2, further comprising:
a fastener, for fixing the lever and thus preventing the same from rotating.

13. The extracting and installing structure of claim 12, wherein the fastener is configured with a first clasp and the lever is configured with a second clasp at a position thereof corresponding to the first clasp; and accordingly the first clasp is capable of interlocking with the second clasp when the lever is rotated toward the fastener.

14. The extracting and installing structure of claim 12, wherein the fastener is disposed on the base.

15. The extracting and installing structure of claim 1, wherein the electrical device has a fourth side, being the side thereof parallel with the first side, and provided for at least one connecting interface to be disposed thereon.

16. The extracting and installing structure of claim 1, wherein the electrical device is a device selected from the group consisting of: a hard drive, a floppy drive and an optical drive.

* * * * *